United States Patent [19]

Bershteyn

[11] Patent Number: 5,414,716
[45] Date of Patent: May 9, 1995

[54] WEIGHTING SYSTEM FOR TESTING OF CIRCUITS UTILIZING DETERMINATION OF UNDETECTED FAULTS

[75] Inventor: Mikhail Bershteyn, Campbell, Calif.

[73] Assignee: Mitsubishi Electronic Research Laboratories, Inc., Cambridge, Mass.

[21] Appl. No.: 107,240

[22] Filed: Sep. 22, 1993

[51] Int. Cl.[6] .......................................... G01R 31/3183
[52] U.S. Cl. ......................... 371/27; 371/23; 371/25.1; 364/717; 364/718
[58] Field of Search ................... 364/717, 718; 371/27, 371/23, 25.1

[56] References Cited

U.S. PATENT DOCUMENTS

| | | | |
|---|---|---|---|
| 3,614,608 | 10/1971 | Giedd et al. | 324/73 |
| 3,719,885 | 3/1973 | Carpenter et al. | 324/73 |
| 3,969,711 | 7/1976 | Ahntholz | 340/255 |
| 3,971,007 | 7/1976 | Borkovitz et al. | 340/255 |
| 3,978,465 | 8/1976 | Goode | 340/255 |
| 3,983,554 | 9/1976 | Goode | 340/413 |
| 4,206,398 | 6/1980 | Janning | 324/51 |
| 4,519,078 | 5/1985 | Komonytsky | 371/25 |
| 4,528,497 | 7/1985 | Arato | 324/51 |
| 4,688,223 | 8/1987 | Motika et al. | 371/27 |
| 4,723,220 | 2/1988 | Smith-Vaniz | 364/492 |
| 4,974,184 | 11/1990 | Avra | 364/717 |
| 5,043,988 | 8/1991 | Brglez et al. | 371/27 |
| 5,331,570 | 7/1994 | Bershteyn | 364/489 |

OTHER PUBLICATIONS

J. Waicukauski et al., "Fault Detetction Effectiveness of Weighted Random Patterns", Proc. of Int. Test Conf., pp. 245-249, 1988.

Primary Examiner—Ellis B. Ramirez
Assistant Examiner—Patrick J. Assouad
Attorney, Agent, or Firm—Robert K. Tendler

[57] ABSTRACT

In integrated circuit testing, a system is provided for reducing testing time by decreasing the number of test vectors or patterns while maintaining high fault coverage through utilizing lists of undetected faults in an integrated circuit to determine the optimal weighting for a weighted random pattern generator that is used for testing the integrated circuit. Undetected faults are derived from testing a model of the circuit under test with a uniform weight pattern, with the circuit modified with each fault from a list of anticipated faults. Undetected faults from this first pass are used to generate another set of weights which are then used to apply test signals to the circuit for generating a further but diminished list of undetected faults. This process is iterative and is continued until the number of undetected faults is either zero or some low acceptable number. The set of weights generated in this iterative process is then used in the weighted random pattern generator for applying test signals to actual circuits. As part of this process, for circuit elements requiring diametrically opposed input signals, such as AND gates and OR gates where a single set of input signals is inappropriate, this conflict is resolved through detecting the fact that for one part, all faults are detected, and then generating test vectors suitable for the opposite circuit. This allows the testing of circuits piece by piece.

5 Claims, 6 Drawing Sheets

WEIGHTING SYSTEM FOR TESTING OF CIRCUITS UTILIZING DETERMINATION OF UNDETECTED FAULTS

FIELD OF INVENTION

This invention relates to electronic circuit testing and more particularly to the testing of very large integrated circuit devices.

BACKGROUND OF THE INVENTION

As described in U.S. Pat. No. 4,688,223 issued to Motika and Waicukauski and incorporated herein by reference, complex large scale integrated circuit devices fabricated on a single semiconductor chip contain thousands of functional circuit elements which are inaccessable for discrete testing. Because of the complexity of the internal interconnections and their combinational interdependencies, testing for device integrity becomes even more time consuming as the number of individual components on the die increases. Recently, as the number of circuit elements increases from thousands to hundreds of thousands, the amount of time and storage necessary in testing such components increases even more dramatically than described in the above-identified patent.

Integrated circuits of such complexity are known to be tested by applying a test pattern of logic signals to the inputs to these circuits. The test pattern consists of "1"s and "0"s, with the frequency of occurrence of the "1"s or "0"s on a given primary input being determined by a so-called weighting factor.

As used herein, weighting refers to controlling the relative frequency of "1"s and "0"s in a random sequence of logic signals used to test digital circuits. Thus, for purposes of the present discussion, weighting defines the frequency of the "1" values in this sequence compared to the frequency of the "0" values. A weighting of 9/10 means that 9 "1"s are produced to every "0" produced. When the frequency of "1"s equals the frequency of "0"s, the sequence is called non-weighted or uniformly distributed.

Weighting as applied to pseudo-random number generation is expressed in terms of the probability that in a given pattern a "1" or a "0" will be generated. This may be expressed in terms of a ratio or percentage.

As described in the Motika et al. patent, weighting is dependent upon the number of circuit elements in the circuit to be tested, and more particularly the number of inputs to these devices. Thus, for larger and larger numbers of circuit elements, since the weighting factor is proportional to the number of inputs which is limited, the calculated weights become very close to uniform distribution weights. Thus there is a considerable increase in the numbers of patterns required to appropriately test the VLSI circuits in question.

In general, testing requires the delivery of certain values, "1"s or "0"s, to the circuit and detecting the response of the circuit. In a so-called random test system, random numbers, not a calculated pattern, are applied to the circuit in order to test all the various states. However, such completely random number generation for testing of circuits is simply impossible to implement due to the numbers of combinations of "1"s and "0"s which would adequately test the circuit.

The problem with completely random number generation is that there may be circuit elements which will not be tested. This is because exercising these elements requires the coincidence of a large number of random events which will not occur within a practical amount of time.

To overcome this, systems have been developed that change the probabilities for the generation of "1s" or "0s" in the random input signals in such a way that the necessary coincidence happens more frequently. This is done by using a weighted random number generator. By techniques that are well known, a particular weight causes more frequent generation of "1s" or "0s" on a given primary input as necessary for exercising the particular circuit.

The problem with this approach is that many circuits impose conflicting requirements for testing their circuit elements. Thus one element may require a large number of "1s" at a given primary input, where another element may require a larger number of "0s".

The Motika et al. patent does not address this issue but rather averages for conflicting requirements. As a result, this system does not permit testing many potential faults.

More particularly, and by way of further background, testing of digital circuits with randomly generated patterns of "1s" and "0s" for random testing purposes is considered to be an attractive alternative to deterministic methods using stored test patterns, each of which are used to detect a fault in the circuit such as a line stuck at either "0" or "1" regardless of the input signals to the corresponding device. Studies of such methods both in the external and the built-in test environment show several major advantages of random testing. Firstly, it allows significant compaction of test data which is especially important for built-in self-test. Secondly, random testing provides cost-effective means of increasing the coverage of faults not explicitly targeted during deterministic test generation.

In order to successfully use random testing techniques one has to address several problems. The most important of them is achieving an acceptable level of fault coverage for a targeted set of faults, usually single stuck-at faults. Several techniques for probabilistic fault coverage estimation have been developed as described by E. J. McClusky, S. Makar, S. Mourad and K. D. Wagner, in a paper entitled Probability Models for Pseudorandom Test Sequences in the Proceedings of the International Test Conference, 1987, p.p. 471–479. Also, advances in fault simulation technology made it possible to quickly evaluate fault coverage of long random test sequences as described in an article by J. Waicukauski and E. Lindbloom entitled Fault Detection Effectiveness of Weighted Random Patterns, in the Proceedings of International Test Conference, 1988, pp. 245–249.

Studies done using these techniques show fault coverage obtainable with the use of uniformly distributed random test patterns to be unacceptably low. It was observed that most practical as well as benchmark circuits contain so called random pattern resistant structures that are very hard to test using uniformly distributed random sequences. An example of such a structure is an n-input AND gate, for which the probability of detecting stuck-at-one faults at the inputs as well as stuck-at-zero fault at the output falls exponentially with the growth of n.

This observation prompted an improvement to the random testing methods where non-uniform probability distributions of test patterns were used and proved to be effective in numerous cases. This is described by P. Bardell, W. McAnney and J. Savir in a book entitled Built-In Test for VLSI, in Pseudorandom Techniques. John Wilkey & Sons, New York, 1987, 354 p. Random testing with non-uniform input signal distribution is called weighted random testing and the probabilities of input signals being equal to 1 are known as input weights.

Several procedures have been developed for calculating optimal weights and are described in the above book by P. Bardell, W. McAnney and J. Savir; by J. Waicukauski, E. Lindbloom, E. Eichelberger and O. Forlenza in an article entitled A Method for Generating Weighted Random Test Patterns, in the IBM Journal of Research and Development, vol. 33, No. 2, March 1989, pp. 149–161; by V. D. Agrawal in an article entitled An Information Theoretic Approach to Digital Fault Testing in the IEEE Transactions on Computers, vol. C-30, August 1981, pp. 582–587; by R. Lisanke, F. Brglez and A. Degeus in an article entitled Testability-Driven Random Test-Pattern Generation in the IEEE Transactions on Computer-Aided Design, vol. CAD-6, No. 6, November 1987, pp. 1082–1087; by H. Wunderlich in an article entitled PROTEST: A Tool for Probabilistic Testability Analysis in the Proceedings of Design Automation Conference, 1985, pp. 204–211; and again by H. Wunderlich in an article entitled On Computing Optimized Input Probabilities for Random Tests published in the Proceedings of Design Automation Conference, 1987, pp. 392–398. Some of the above systems are heuristic, based on circuit structure analysis. Others are based on analytical calculation of fault detection probabilities and use optimization, hill climbing, techniques to reach a maximum of these probabilities in the n-dimensional space of input weights. Attempts were also made to obtain optimal weights by randomizing the set of functional test vectors for a circuit as described in an article by F. Siavoshi entitled WTPGA: A Novel Weighted Test-Pattern Generation Approach for VLSI Built-In Self Test in the Proceedings of International Test Conference, 1988, pp. 256–262. For many circuits the results of weighted random testing are significantly better than those obtained with uniformly random tests both in terms of fault coverage and test length. However, as described by E. Eichelberger, E. Lindbloom, J. Waicukauski and T. Williams in a book entitled Structured Logic Testing, published by Prentice Hall, Englewood Cliffs, N.J., 1991, 183 p., it was further observed that some structures in logic circuits are resistant even to weighted random testing. The classical example of such a structure is n-input AND gate and an n-input OR gate which have their corresponding inputs connected. Obviously, detecting faults at the terminals of the AND gate require the values of input weights to be different from those necessary for the OR gate. Averaging on these requirements as suggested by the known weight calculation techniques will produce patterns with a uniform distribution which have been proven ineffective for both gates.

Based on this experience, it was conjectured that high fault coverage can only be obtained by weighted random tests using multiple sets of weights.

The basic idea underlying efforts to calculate multiple weight sets is of partitioning the fault set into subsets that can be covered by a single vector of weights. As described by H. Wunderlich in an article entitled Multiple Distributions for Biased Random Test Patterns published in the IEEE Transactions on Computer-Aided Design, vol. 9, No. 6, June 1990, pp. 584–593, Wunderlich partitions the fault set explicitly by including each fault into one of the partitions in a way that maximizes a cost function based on the gradient of detection probability. The method is expensive computationally and it is only as accurate as the fault detection probability estimation algorithm which is used in these calculations. However, it is known that the exact detection probability calculation problem is NP-complete. Also estimation algorithms which achieve a given level of accuracy in polynomial time can not be built.

A completely different approach to the partitioning problem described is based on the observation that the faults which require similar input weights to improve their detectability are often grouped within the same structural partitions of the circuit under test. Although this observation was first made by Waicukauski et al. as described in the above article, the WRP method introduced there tries to create approximately equal level of switching activity throughout the circuit and fails to concentrate on subcircuits with undetected faults in them.

It will be appreciated that weighted random test pattern generation has been utilized for a considerable time in the testing of complex circuitry primarily in large scale integration. For reference, such a system is described in U.S. Pat. No. 3,719,885 issued to Robert Gordon Carpenter et al. on Mar. 6, 1973 and incorporated herein by reference.

SUMMARY OF THE INVENTION

While the above mentioned averaging of switching activity does not solve the problem of optimal frequencies of "1s" or "0s" for particular circuits, and also does not accomplish partitioning, it has been found that a certain weighting pattern of the frequencies of "1s" and "0s" applied to primary inputs provides much improved results when the weighting pattern is based on so-called "undetected faults". Undetected faults are those faults in a model of the circuit under test which remain undetected when the model is modified to simulate a fault and no resultant faulty output is detected.

By probing the model after faults are introduced and keeping track of the test results, a weighting pattern in terms of a set of weights can be derived for the particular circuit. The result of using these optimal weights is either higher fault coverage or the generation of fewer test patterns or vectors, or both.

In order to accomplish this, a system is provided for reducing testing time by decreasing the number of test vectors or patterns while maintaining high fault coverage through utilizing lists of undetected faults in an integrated circuit to determine the optimal weighting for a weighted random pattern generator that is used for testing the integrated circuit. Undetected faults are derived from testing a model of the circuit under test with a uniform weight pattern, with the circuit modified with each fault from a list of anticipated faults. Undetected faults from this first pass are used to generate another set of weights which are then used to apply test signals to the circuit for generating a further but diminished list of undetected faults. This process is iterative and is continued until the number of undetected faults is either zero or some low acceptable number. The set of weights generated in this iterative process is then used in the weighted random pattern generator for applying test signals to actual circuits. As part of this process, for circuit elements requiring diametrically opposed input signals, such as AND gates and OR gates where a single set of input signals is inappropriate, this conflict is resolved through detecting the fact that for one part, all faults are detected, and then generating test vectors suitable for the opposite circuit. This allows the testing of circuits piece by piece. For circuit elements for which opposite circuits still have undetected faults, a fanout contradictional analysis procedure is provided to determine optimal weighting to effectively isolate the testing of the opposite circuits.

For purposes of the Subject Invention, "fanout" is a connection of blocks in an electric circuit where the output of one block, the fanout "stem", feeds the inputs of several blocks via fanout "branches". For purposes of the Subject Invention, "fanin" is a connection of blocks in an electric circuit where the outputs of several blocks feed the input of a single block. The "fanin cone" of a given block is the subset of blocks in an electric circuit in which the output of each block in this subset feeds one of the inputs of the given block either directly or indirectly through other blocks. Note that for each branch there is a block corresponding to one or more subcircuits. Therefore, for each branch from a fanout stem there is at least one subcircuit.

This having been said, the above fanout contradiction analysis procedure examines the weight set calculated for each fanout branch separately. If any of them suggest weight bias towards more frequent generation of "1" values at the same time as some other branches have weights with higher probability of "0" values then the contradiction is detected. This contradiction is resolved by chosing a group of branches that have non-contradictory weights and dropping the other branches from consideration. The choice is made on the basis of a larger number of potentially detectable faults in the subcircuits controlled by different branches of the fanout. After chosing the weight for a fanout stem, the weights for the associated branches are adjusted so that their values are consistent with the weight for the stem.

The fundamental difference between the fanout processing method of this invention compared to the procedure described in the above-mentioned U.S. Pat. No. 4,688,223 is that conflicting weights are not averaged but rather a decision is made in favor of a bigger subset of undetected faults and to the detriment of a smaller subset of undetected faults. This difference makes it possible to build an iterative procedure for the calculation of weight sets which results in the generation of a highly effective sequence of several weight sets. On the other hand, such a result is fundamentally impossible to achieve through the procedure described in the above-mentioned patent which can only produce one weight set averaged over numerous conflicting requirements of different anticipated faults.

More particularly, a system is provided for determining the frequency at which "1s" or "0s" are applied to primary inputs of a circuit under test. The frequency or probability is determined by a set of weights derived by the determination of undetected faults in a model of the circuit probed with a random pattern with uniform weights. Any difference in circuit output between a no-fault circuit configuration and a circuit configuration derived from a list of anticipated faults is then detected. If the output of the circuit configured for an anticipated fault is different from the expected no-fault result this indicates that the fault has been detected. This fault is then dropped from the detected fault list and as such is disregarded in further iterations. What is left is a list of undetected faults which are applied to a weighting function generator that generates a set of calculated weights as opposed to uniform weights. This set of calculated weights is stored and is then used to generate random patterns of logic signals, having a frequency of "1s" or "0s" based on the weight, with logic signals being applied to the circuit in an iterative process to ascertain a new and diminished list of undetected faults. The iteration continues until the number of undetected faults is either zero or at least at some minimal level. Having derived a set of weights from the iterative process, this set of weights is utilized in the generation of test signals applied to the actual circuit under test, with result that since all faults have been identified they will be detected with a high degree of certainty and with a smaller number of test patterns.

BRIEF DESCRIPTION OF THE DRAWINGS

These and other features of the Subject Invention will be better understood taking in view of the Detailed Description taken in conjunction with the Figures of which.

DETAILED DESCRIPTION

Figure 1A:
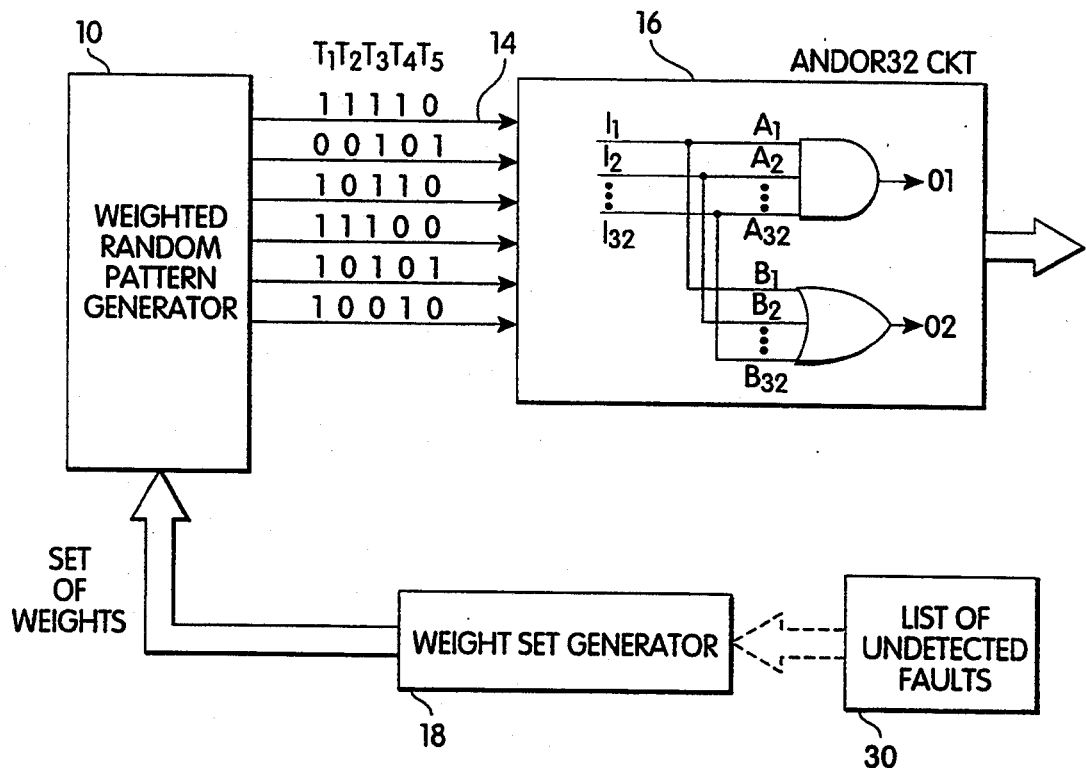
FIG. 1A is a teach diagram of the Subject System indicating the generation of weighted random patterns of logic signals applied to a circuit under test in which the weighting is determined by a list of undetected faults.

With all of the above attempts to obtain optimal weights in essence failing, referring now to FIG. 1 the Subject System includes a weighted random pattern generator 10 which provides test patterns of 1s and 0s on lines 14 to a circuit under test 16, which for purposes of the present discussion is considered to consist of a 32 input AND gate and a 32 input OR gate, with inputs connected in parallel as illustrated.

The weighted random pattern generator 10 is conventional in the sense that it is controlled to provide patterns of 1s and 0s as outputs to test the actual circuit under test. The ratios of 1s and 0s is determined by a weight set generator 18 which applies the appropriate weighting function so that for instance on line 14 a series of 1s followed by a 0 is applied in time slots, T1, T2, T3, T4 and T5. As can be readily seen, the probability of a 1 existing on line 14 is 4 out of 5, there being a 4/5 probability of a 1 on this line. It will of course be appreciated that in order to check out the AND gate of circuit 16, namely AND gate 20, all of its inputs should initially be logic level "1" in order to achieve a logic level "1" output. Then all but each one of these inputs should be set to logic level "1" to ascertain the correct functioning of the remaining inputs set to logic level "0".

However, such a series of logic level "1" inputs would not result in the testing of OR gate 22 as a logic level "1" signal on any one of its input lines would result in a logic level "1" at its output. In fact, in order to appropriately test an OR gate, there are $2^{32}$ permutations of signals. One way to test the OR gate is to assure that all of the signals to its inputs are 0, with a fault being detected at the output of the OR gate as a logic level "1" signal. Then one applies the sequence of patterns where all but each one of the inputs are set to "0" in order to ascertain the correct functioning of the remaining input which is set to "1". From the above illustration it will be appreciated that the appropriate test signals for the AND gate are logic level "1" signals, whereas the appropriate test signals for the OR gate are logic level "0" signals.

As described above, it has been found in general that random patterns of 1s and 0s are useful in detecting faults in such circuits. Moreover, it will be appreciated from the above discussion that uniformly distributing the 1s and 0s applied to a given input line called a primary input, is relatively unsatisfactory for high reliability fault testing.

In order to optimize the above systems such that the optimal weighting pattern is achieved, the weight set generator 18 produces a set of weights for a particular circuit under test which governs the probability of a 1 or 0 being on any one of the input lines to the primary inputs of the circuit. Thus the generator 18 produces a set of weights in accordance with the development of a list of undetected faults 30 for the circuit under test. It will be shown that generating a set of weights derived through the utilization of undetected faults results in a significantly higher probability of fault detection and, with a significantly decreased number of patterns.

Figure 1B:
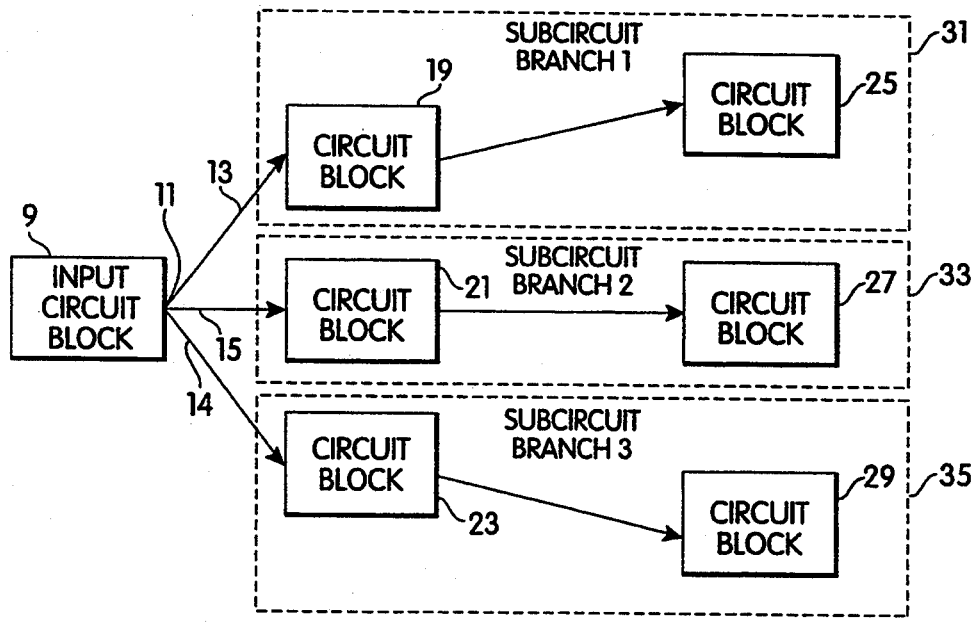
FIG. 1B is a diagram of a typical fanout structure for a portion of the integrated circuit of FIG. 1A.

Referring now to FIG. 1B, the integrated circuit to be tested can be characterized as having an input block or element 9, the output of which constitutes a fanout stem 11, from which branches 13, 15 and 17 are paths from the fanout stem to blocks or elements 19, 21 and 23, respectively. Each of these blocks is connected to further blocks or elements 25, 27 and 29, respectively.

As such, the blocks associated with branch 1, namely blocks 19 and 25, denote subcircuits controlled by branch 1 as indicated by dotted box 31; with blocks 21 and 27 corresponding to subcircuits controlled by branch 2 as illustrated by dotted box 33; and with blocks 29 and 23 corresponding to subcircuits controlled by branch 3, as illustrated by dotted box 35.

As such FIG. 1B illustrates a typical fanout structure in which various subcircuits within an integrated circuit are controlled by respective branches from a single fanout stem.

Figure 2:
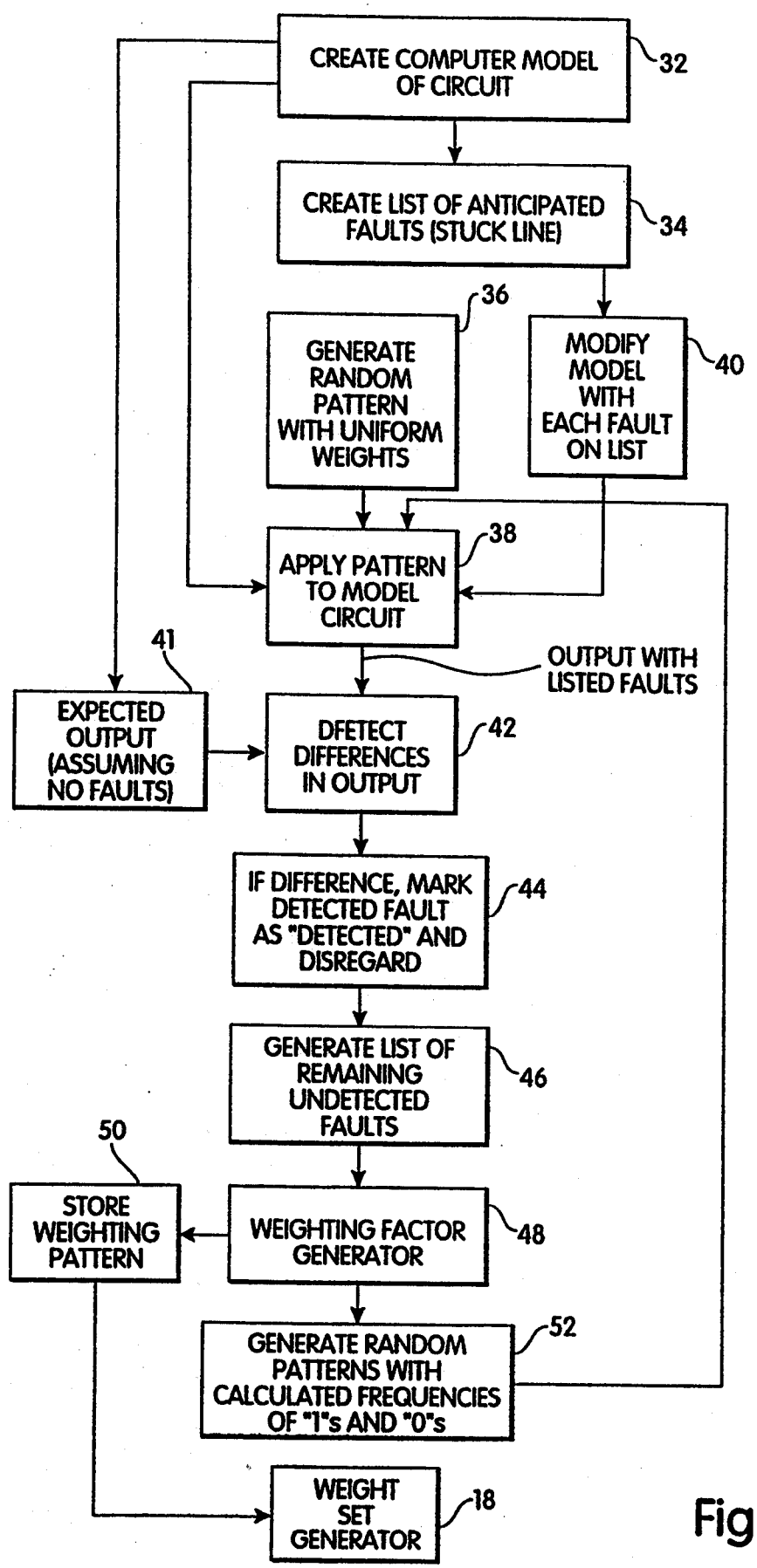
FIG. 2 is a block diagram of the system for determining the optimal set of weights for a particular circuit such that these weights can be utilized by the weighted random pattern generator of FIG. 1.

Referring now to FIG. 2, in order to generate the set of weights utilized by the weighted random pattern generator, it is first necessary, as illustrated at 32 to create a computer model of the circuit in question. Having created the computer model, it is then necessary to create a list of anticipated faults as illustrated at 34. The list of anticipated faults would be those associated with, for instance, an input line being stuck at 1 or 0. The result of this line being stuck at 1 or 0 would have an anticipated result at the output of the corresponding element.

Having created a list of anticipated faults through analysis of the circuit in question, the next step is to generate a random pattern of logic signals as illustrated at 36 with the pattern to have uniform weights. This means that the probability of there being a 1 or 0 on a given input line is 50%. The output of the random pattern generation is applied to the computer model at 38, with the model circuit having been modified at 40 with each of the listed faults that are anticipated. This in essence reconfigures the model circuit with an individual fault, with the output of the circuit then being tested to detect, as illustrated at 42, any differences between the circuit modified with the fault as opposed to the circuit assuming no faults.

If, as illustrated at 44, there is a difference in the output between the no-fault and fault-induced case, this means that the fault has in fact been detected. This result is noted or marked and the fault is removed from the undetected fault list. What is left is a diminished list of undetected faults. This list of remaining undetected faults resulting from this iteration of the test of the model circuit, as illusted at 46, is utilized by a weighting function generator 48, the purpose of which is to derive a calculated set of weights for each input of the circuit. What in essence generator 48 does is to specify through a unique calculation the probability or frequency of 1s or 0s on a given input line. The result of the weighting function generator is stored at 50 and is utilized to generate random patterns of logic signals with calculated frequencies of 1s and 0s. The generation of these patterns of 1s and 0s is accomplished at 52 and is then applied back to circuit at 38 in an iterative fashion to generate a new set of weights at the output of weighting function generator 48. Now the weights are calculated as described in connection with FIGS. 3–6.

It will be appreciated that after each iteration the number of undetected faults in the list will decrease because some of the previously undetected faults will have been detected in a previous iteration. When the number of undetected faults goes to 0, or is at least some predetermined low number, then the process is stopped and the stored weights for the iterations are utilized directly via weight set generator 18 to supply the set of optimal weights to the weighted random pattern generator 10 of FIG. 1.

Hereinafter what will be appreciated is that in creating the list of anticipated faults, one can pick and choose which part of the circuit under test one wishes to test by the particular weight set. This is accomplished since the detected faults, for instance, of the AND gate, will be disregarded in later test pattern generations.

In short, anticipated faults for the AND gate will have been detected if, for instance, the probability of 1s at all AND gate inputs approaches 1. As mentioned hereinbefore, this is totally unsuitable for the OR gate element. Probing the model circuit with these test patterns or vectors will result in undetected faults. To alter the subsequent test vectors to test the OR gate the weight set is altered through the operation of the weighting function generator to produce test vectors with probabilities of "1" approaching "0" at the input lines to the OR gate.

In the matter, through the iterative generation of the set of weights, one can address all portions of a circuit and adequately test them 100%.

In order to aid in the description of this Subject Invention, the following assumptions are made. Firstly, it is assumed that the circuit under test is a combinational or fully-scannable circuit consisting of AND, OR, NAND, and NOR gates. Therefore, all calculations are performed on the combinational model of a full-scan circuit with primary inputs and primary outputs inserted instead of scan register elements. Secondly, because this work is focused on the problem of weight sets generation, aliasing due to output sequence compaction is not considered here. Detailed analysis of the aliasing problem including the estimation of aliasing probabilities can be found in the above articles by Eichelberger et al. and Bardell et al. This analysis shows that at least the steady-state values of aliasing probabilities that are of major interest for testing with long random sequences, mostly depend on the characteristics of a signature analyzer, e.g., number of states, characteristic polynomial, and so aliasing problem can be considered independently of the problem of weights computation. Therefore, whenever in the course of this application fault detection or fault coverage is mentioned, it refers to the fact that the faulty values can be observed at primary outputs or latched into scan registers.

The method of calculating multiple sets of weights based on circuit structure performed by weighting factor generator 48 of FIG. 2 is presented using the example of circuit in FIG. 1 denoted further as ANDOR 32 circuit. It consists of a 32-input AND gate and a 32-input OR gate with respective inputs connected to the same 32 primary inputs of the circuit.

Let us assume that the initial fault set for this circuit includes stuck-at-1 faults at the inputs of the AND gate, stuck-at-0 faults at the inputs of the OR gate and both stuck-at-0 and stuck-at-1 faults at the outputs of the gates. All faults are initially undetected. The only two faults that will be detected within the reasonable number of trials by applying uniformly distributed random pattern sequence to this circuit would be the stuck-at-1 at the output of the AND gate and the stuck-at-0 at the output of the OR gate. If we apply the method described in the above-mentioned U.S. Pat. No. 4,688,223, also known as the WRP method, we obtain weighting factors 32:1 in favor of value 1 for the inputs $A_i$ of the AND gate and the same in favor or value 0 for the inputs $B_i$ of the OR gate. At the fanout points these factors get averaged to 32:32 and produce the same uniform set of weights that cannot be used to detect 66 out of 68 faults of the original set. Furthermore if somehow all faults at the terminals of the AND gate get detected and removed from the list of undetected faults, the WRP algorithm does not recognize that the contradiction no longer exists and produces the same set of weights again. These observations lead to the conclusions that the WRP method does not work for the ANDOR 32 circuit for the following reasons.

First, WRP always averages weighting factors at fanout points and therefore it is unable to partition fault set according to conflicting requirements on fanout branches. Secondly, WRP uses the number of device inputs (NDI) rather than the number of undetected faults in the fanin cone of the line as a measure of switching activity necessary for fault detection and therefore it cannot create the conditions favoring detection of faults that remain untested after the application of previous weight sets.

WEIGHT SET CALCULATION

The subject new weights calculation algorithm presented hereinafter is designed to overcome these problems. To describe one starts with a following definition.

Definition. Let 1 be a line in the circuit under test. Let f be an undetected fault defined on a line t that belongs to the fanin cone of the line 1. Fault f is called 0-implying (1-implying) on the line 1 if one of the following conditions is true: f is stuck-at-1 (stuck-at-0) and there is a path from t to 1 with even number of inverters on it, or f is stick-at-0 (stuck-at-1) and there is a path from t to 1 with odd number of inverters on it.

Obviously a fault can be both 0-implying and 1-implying if paths of both parities are present.

As illustrated in FIGS. 3-6, the algorithm consists of three phases. During the first phase the number of 0-implying faults (NF0) and the number of 1-implying faults (NF1) are calculated for each line in the circuit. This calculation is performed in direct levelized order starting from the lowest level gate that has undetected faults associated with it. All gates reachable from the site of each fault are found and their corresponding NF0 or NF1 counters are incremented. In order to reduce the complexity of this procedure the gates are grouped into fanout-free regions so that the sets of reachable gates for all faults in every region could be computed simultaneously.

Figure 3:
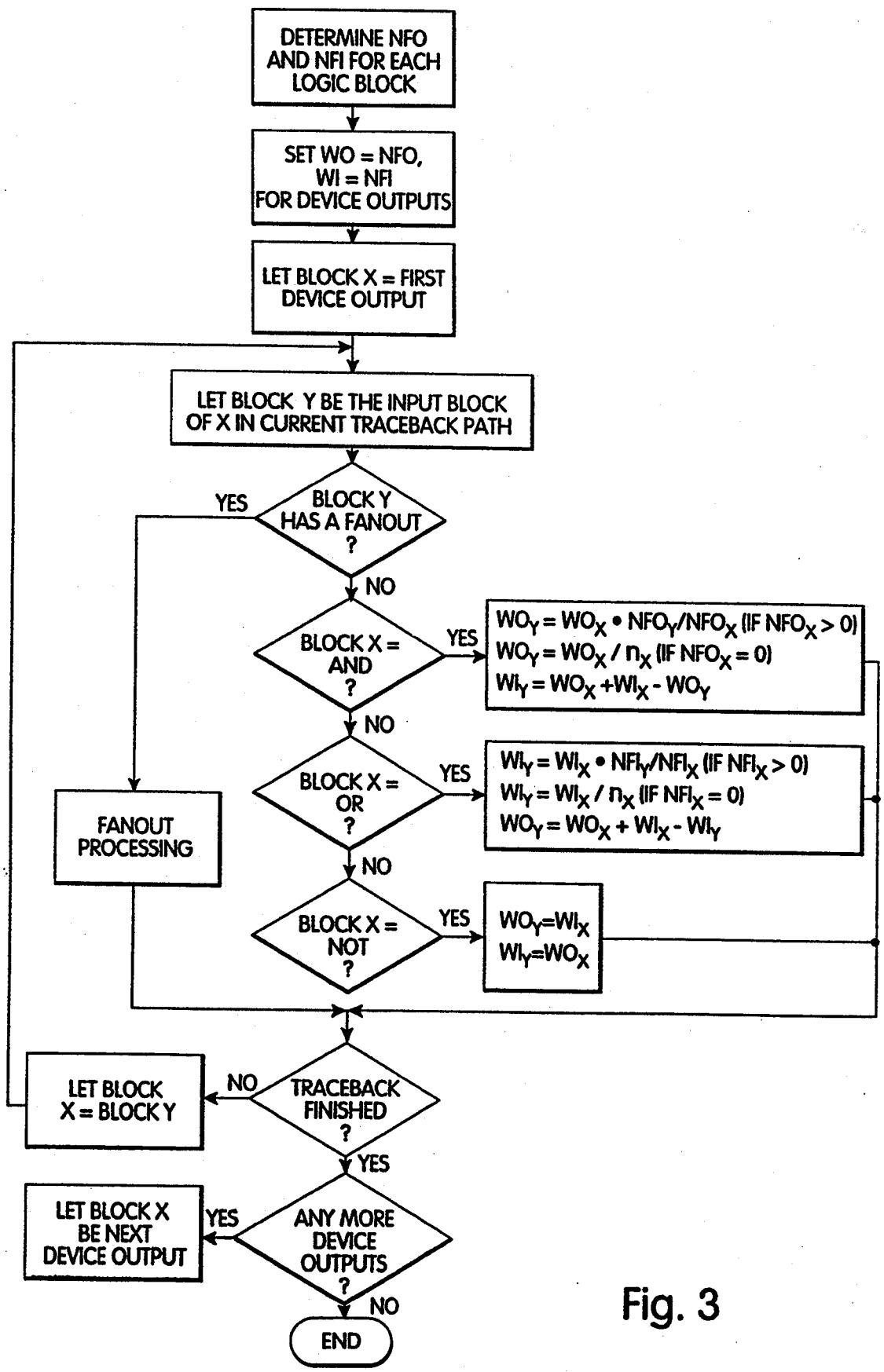
FIG. 3 is a flow chart indicating the process for weight set calculation.

Referring now to the flow chart of FIG. 3, during the second phase 0-weight (W0) and 1-weight (W1) are calculated for each line of the circuit. This calculation starts from primary outputs and proceeds in reverse levelized order. Finally, the probability of 1 at a given primary input is computed as $p=W1/(W0+W1)$ if $W0+W1>0$ or $p=\frac{1}{2}$ if $W0+W1=0$.

The calculation of W0 and W1 is performed for each line using the following formulas.

If the line is a primary output of the circuit them $W0=NF0$; $W1=NF1$.

If the line is an input of an inverter with output line k, then $W0=W1_k$ $W1=W0_k$ where $W0_k$ and $W1_k$ are the values calculated for line k.

If the line is an input of an n-input AND gate with output line k, then as Equation 1:

$$W0=W0_k*NF0/NF0_k>0 \text{ if } NF0_k>0, \text{ and}$$
$$W0=W0_k/n \text{ if } NF0_k=0; \quad W1=W0_k+W1_k-W0.$$

The rationale behind this calculation is to try to equalize the probabilities of detecting the faults. Obviously for a primary output, that means that the ratio of the number of ones to the number of zeros in a test sequence should be equal to the ratio of the numbers of faults implying these values in fan-in cone of this primary output. For an AND gate it means that if some faults that imply a controlling value exist in the gate's cone, $NF0_k>0$, then the controlling value weight $W0_k$ for the output of the gate should be distributed among gate's inputs proportionally to the numbers of NF0s calculated for these inputs. In case there are no faults implying controlling value ($NF0_k=0$) but some number of these values are necessary to justify propagation conditions of faults outside the gate's fan-in cone (in which case $W0_k>0$), then this number may be evenly distributed among gate's inputs. A weight for the non-controlling value is calculated in such a way that the sum of input weights is equal to the sum of output weights.

Correspondingly if the line is an input of an n-input OR gate with output line k then as Equation 2:

$$W1=W1_k*NF1/NF1_k \text{ if } NF1_k>0 \text{ and } W1=W1_k/n$$
$$\text{if } NF1_k=0; \quad W0=W0_k+W1_k-W1.$$

Similar formulas can be easily derived for NAND and NOR gates by modeling them with corresponding AND/OR gates and inverters.

Figure 4:
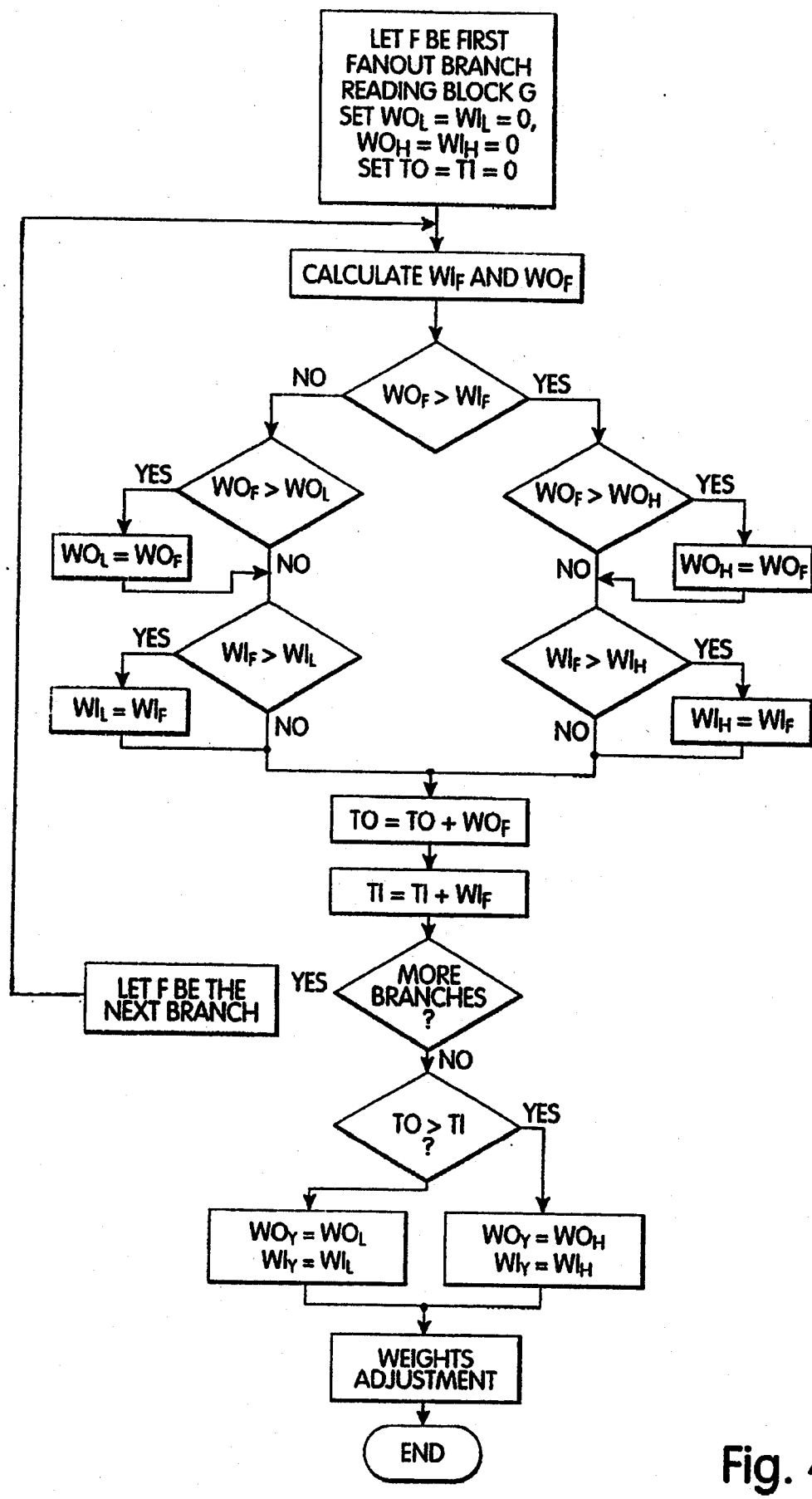
FIG. 4 is a flow chart indicating the process for fanout processing.

In terms of fan out, and referring now to FIG. 4, calculation of W0 and W1 values for fanout stems proceeds as follows. First $W0_i$ and $W1_i$ are calculated for each fanout branch $i(i=1, \ldots, n)$. After that two possible pairs of W0 and W1 values are calculated for the fanout stem. One is a pair of average values $W0_H$ and $W1_H$ for all fanout branches with $W1_i > W0_i$, if any, and the other is a pair of average values $W0_L$ and $W1_L$ for all fanout branches with $W1_i < W0_i$ (if any).

Finally the choice is made between these two pairs of values on the basis of comparison between the totals of all zero-weights and one-weights $T0 = \Sigma W0_i$ and $T1 = \Sigma W1_i$.

Figure 5:
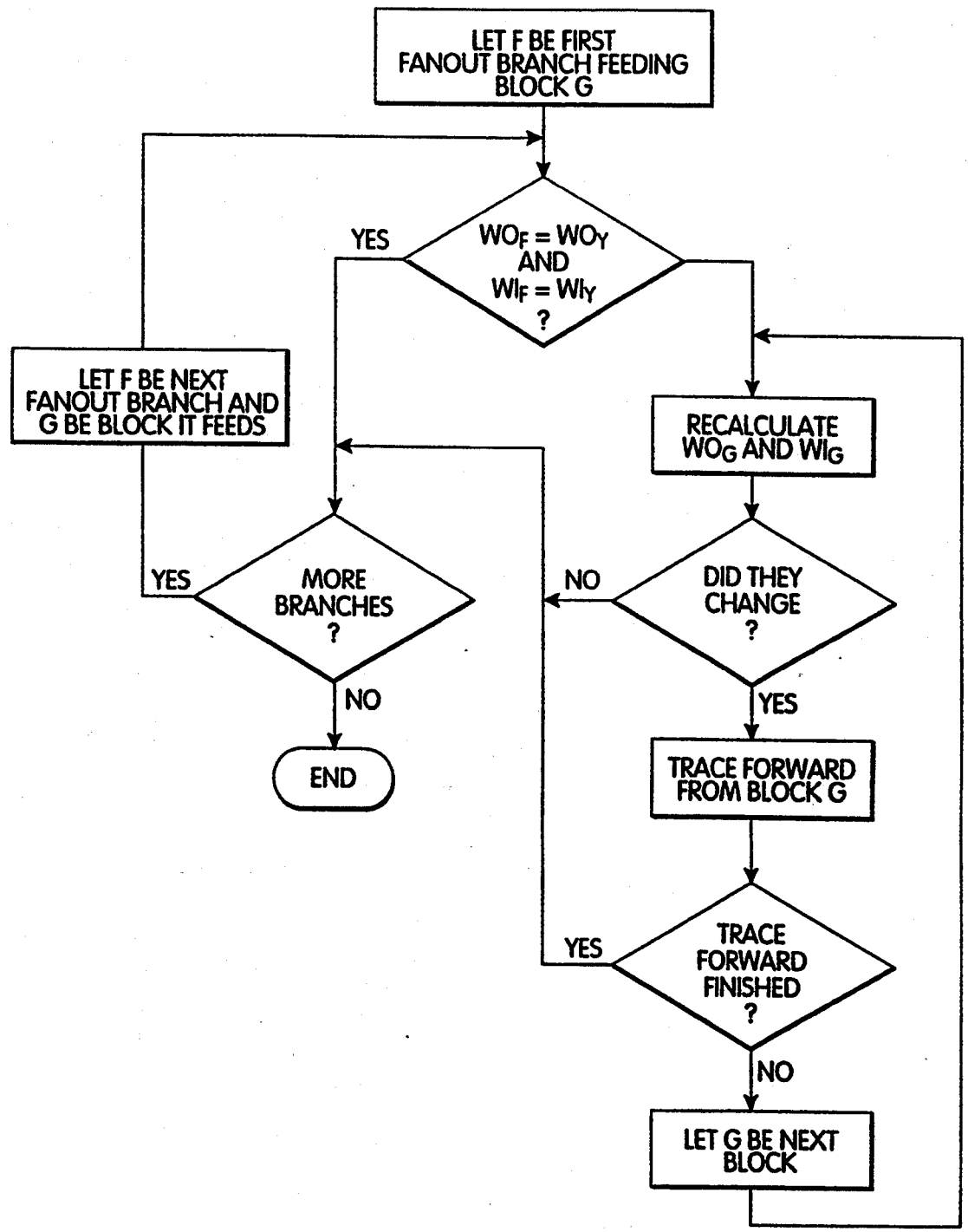
FIG. 5 is a flow chart indicating the process for adjustment of the weights; and, FIG. 6 is a flow chart indicating the process for recalculation of weights for one block.
Figure 6:
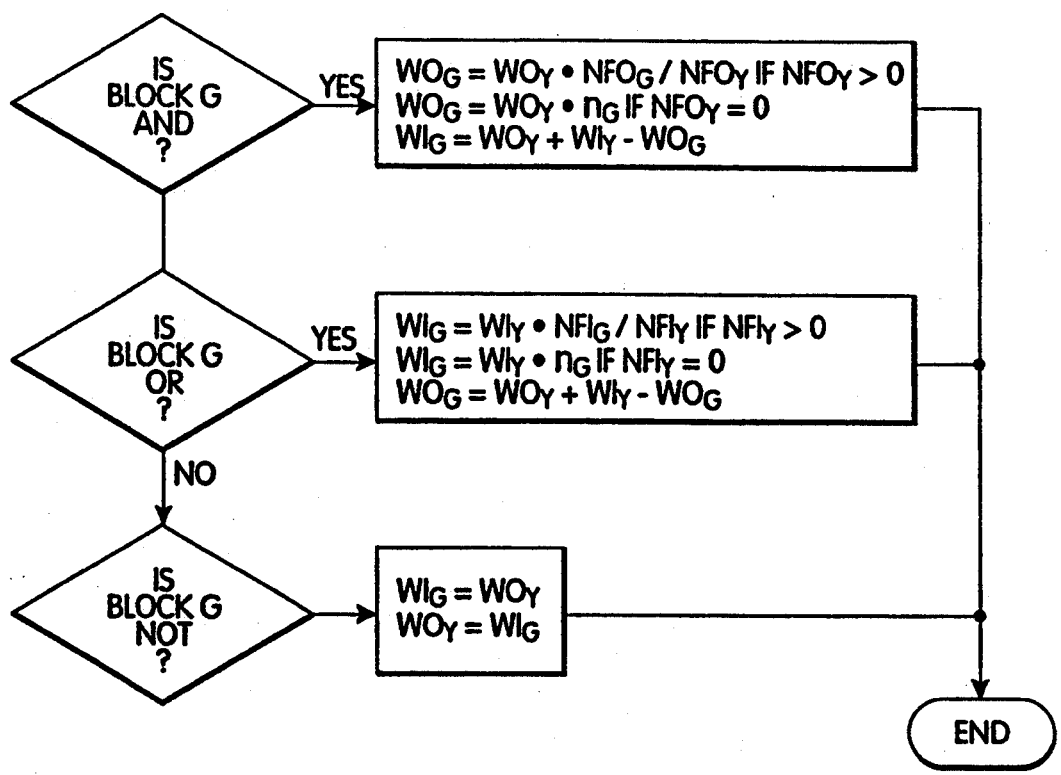

This decision effectively partitions the set of undetected faults into the subset which is pursued further and the other one which is abandoned. In order to facilitate the consistency of the decisions made at different fanout points in favor of the same subset of faults, as illustrated in FIG. 5 weight adjustment is performed for the lines controlled by fanout branches for which $W0_i$ and $W1_i$ are different from the values W0 and W1 finally assigned to the stem.

To calculate, $W0_H$, $W1_H$, $W0_L$ and $W1_L$ the heuristic of WRP algorithm is used. This means that the maximum of the values $W1_i$ for all branches with $W1_i < W0_i$ is assigned to $W1_L$; maximum $W0_i$ for the same branches is assigned to $W0_L$, and so on. Finally if $T0 > T1$ then $W0_L$ and $W1_L$ are assigned to fanout stem. Otherwise $W0_H$ and $W1_H$ are used.

The weight adjustment procedure performs the reverse calculation to the one defined by Equations 1 and 2. It starts from a fanout stem f where conflicting weight requirements were detected at different branches. The values W1, W0, NF1 and NF0 for the gates controlled by each fanout branch are changed in such a way that the new values satisfy the Equations (1) and (2) with W0 and W1 values assigned to the fanout stem. This operation is performed in a different way depending on whether or not there are faults implying a gate's controlling value in the fanin cone of a fanout stem. For example for an AND gate with $NF0 > 0$ the value NF0 is changed so that the values of W0 at its input and output satisfy equation (1). This change is propagated further until it becomes irrelevant. As one can see NF0 does not play any role in the equation (2) for an OR gate. If a gate has no faults implying controlling values in its cone (NF0=0) then equation (1) is satisfied by a proportional change of the value W0 for gate's output signal. The main purpose of this heuristic adjustment procedure is to make the future partitioning decisions on other fanouts converging on the same gate with f take into account the partitioning decision made for fanout f.

Let us demonstrate the described weights calculation algorithm using the example of circuit ANDOR32. The following testing scenario is considered. After simulating uniformly distributed random patterns the undetected faults are: stuck-at-1 faults at the lines A1-A32 and O2, and stuck-at-zero faults at the lines B1 and B32 and O1. Therefore the first phase of the algorithm calculates the values $NF0_{A1} = \ldots = NF0_{A32} = 1$; $NF1$; $NF1_{A1} = \ldots = NF1_{A32} = 0$; $NF1_{B1} = \ldots = NF1_{B32} = 1$; $NF0_{B1} = \ldots NF0_{B32} = 0$; $NF0_{o1} = 32$; $NF1_{o1} = 1$; $NF0_{o2} = 1$; $NF1_{o2} = 32$.

The second phase starts with assigning $W0_{o1} = 32$; $W1_{o1} = 1$; $W0_{o2} = 1$; $W1_{o2} = 32$. Let us assume that next line to be evaluated is 11. To evaluate fanout stem weights, weights for fanout branches have to be calculated first. They are $W0_{A1} = 1$; $W1_{A1} = 32$; $W0_{B1} = 32$; $W1_{B1} = 1$ according to the equations (1) and (2). Furthermore $W0_L = 32$; $W1_L = 1$; $W0_H = 1$; $W1_H = 32$. Because $T0 = T1 = 33$ an arbitrary decision has to be made. Let us assume that values $W0_{11} = 1$; $W1_{11} = 32$ are chosen. In this case weight adjustment is necessary for the gates controlled by the branch B1. This adjustment results in assignment of $NF1_{o2} = 1$ that satisfies equation (2) for OR gate. The next step is evaluation of fanout stem 12. Now $W0_{A2} = 1$; $W1_{A2} = 32$; $W0_{B2} = 1$; $W1_{B2} = 32$. Because there is no conflict between the weights assigned to branches $W0_{12} = 1$ and $W1_{12} = 32$ and no weight adjustment is necessary. Proceeding the same way for other inputs we obtain set of weights 32/33 which is optimal for AND gate. This calculation demonstrates the important role of weights adjustment in this algorithm. Although, because of the symmetry of the circuit, the first partitioning decision had to be made arbitrarily, all other decisions were forced to be consistent with the first one.

After simulating a random pattern sequence with the calculated weights all faults at the terminals of the AND gate will be marked detected. After that the weights calculation procedure is executed again to calculate the next set of weights. Because the list of undetected faults has changed, the first phase of the algorithm will produce $NF0_{A1} = \ldots = NF0_{A32} = 0$; $NF1_{A1} = \ldots = NF1_{A32} = 0$; $NF1_{B1} = \ldots = NF1_{B32} = 1$; $NF0_{B1} = \ldots = NF0_{B32} = 0$; $NF0_{o1} = 0$; $NF1_{o1} = 0$; $NF0_{o2} = 1$; $NF1_{o2} = 32$. The second phase will produce $W0_{o1} = 0$; $W1_{o1} = 0$; $W0_{o2} = 1$; $W1_{o2} = 32$. For each fanout stem there will be one branch with $W0 = W1 = 0$. This case is considered special and such branches are not considered for fanout evaluation or weights adjustment. The reason is that when $W0_1 = W1_1 = 0$ it means that the value of line 1 is a don't care for all test patterns that detect any remaining fault. Therefore no conflict will be detected for any of the fanout stems and the values $W0 = 32$; $W1 = 1$ will be assigned to all circuit inputs. The resulting set of weights, 1/33 each, allows quick detection of all remaining faults at the terminals of OR gate.

An experimental run of the program that implements the described algorithm produces uniform and two non-uniform probability distributions for the circuit ANDOR 32. Each time generation of random patterns with a given distribution was stopped after 8192 consecutive unsuccessful tries. The resulting test sequence lengths are 1, 287, and 300 and all 68 faults were detected. On the other hand an experiment with $5 * 10^8$ uniformly distributed random tests have shown only 8 of 68 faults detected.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A system for reducing testing time of digital integrated circuits by decreasing the number of test vectors utilized while maintaining high fault coverage without deterministic testing, comprising:

means for first determining all faults for a predetermined integrated circuit and for generating a set of calculated weights;

means for testing said integrated circuit with said set of calculated weights for generating a reduced list of undetected faults;

means for iteratively testing said integrated circuit with calculated weights from successively reduced lists of undetected faults by calculating additional weights directly from the reduced list of undetected faults from the previous iteration, said iteration to continue until a predetermined low number of undetected faults exists;

a weighted pattern generator for producing test vectors coupled to inputs to said integrated circuit; and, means for applying said calculated sets of weights to said weighted pattern generator, thereby to provide said generator with an optimal set of weights that decrease the number of test vectors provided by said weighted pattern generator to reduce said testing time.

2. The system of claim 1, wherein said integrated circuit includes two sets of circuits having opposite responses to the same set of input signals and further including means for determining optimal weighting test vectors for each of said two sets of circuits, and means for isolating said two sets of circuits during testing based on said determination.

3. The system of claim 2, wherein said integrated circuit has an input block having a fanout stem, a series of branches associated therewith, and a series of blocks, each associated with a different branch and each including different subcircuits, said system further including:

means for separately examining weights calculated for each of said branches of said integrated circuit to ascertain and indicate if a set of weights for any branch indicates a weight bias towards more frequent generation of logic level "1" signals, while weights for other branches indicate more frequent generation of logic level "0" signals; and means for dropping from testing all branches having sets of weights with a weight bias toward more frequent generation of a "1" or "0".

4. The system of claim 3, wherein said dropping means operates on the basis of selecting for testing those branches having circuits with a larger number of detectable faults.

5. The system of claim 4, wherein the branches having the larger number of detectable faults are associated with an identifiable fanout stem, wherein said identifiable fanout stem is provided with a selected set of weights and further including means after having a selected set of weights for said identifiable fanout stem for adjusting the weights for associated branches such that the sets of weights for associated branches are consistent with the set of weights for said fanout stem.

* * * * *